United States Patent [19]
Brosh et al.

[11] 4,115,767
[45] Sep. 19, 1978

[54] APPARATUS FOR CONVERTING AN ANALOG SIGNAL INTO DIGITAL FORM PARTICULARLY ADAPTED FOR USE IN DIGITAL COUNTER DISPLAYS

[75] Inventors: Amnon Brosh, Montvale, N.J.; Dana F. Geiger, New York, N.Y.

[73] Assignee: Kulite Semiconductor Products, Inc., Ridgefield, N.J.

[21] Appl. No.: 746,240

[22] Filed: Dec. 1, 1976

Related U.S. Application Data

[62] Division of Ser. No. 631,383, Nov. 12, 1975, Pat. No. 4,041,289.

[51] Int. Cl.² ............................................. H03K 13/20
[52] U.S. Cl. ....................... 340/347 CC; 177/DIG. 3; 307/271; 328/140; 340/347 M; 324/78 D
[58] Field of Search .... 340/347 M, 347 AD, 347 NT, 340/347 CC; 324/78 D, 77 A, 99 D; 177/210 FP, DIG. 3; 332/16 R, 1; 331/177 R; 307/261, 271; 328/132, 140; 235/92 FQ, 92 TF, 92 WT

[56] References Cited

U.S. PATENT DOCUMENTS

| | | | |
|---|---|---|---|
| 2,987,674 | 6/1961 | Shain | 324/78 D |
| 3,659,665 | 5/1972 | Godwin et al. | 177/210 FP |
| 3,694,745 | 9/1972 | Thrap | 324/78 D |
| 3,833,903 | 9/1974 | Gordon et al | 340/347 M |
| 4,031,532 | 6/1977 | First | 340/347 NT |

OTHER PUBLICATIONS

Hnatek, A User's Handbook of D/A and A/D Converters, J. Wiley & Sons, 6/1976, pp. 245, 255-260 & 305-312.

The Engineering Staff of Analog Devices, Inc., Analog-Digital Conversion Handbook, 6/72, pp. I-33 & I-34, I-105, 106.

*Primary Examiner*—Thomas J. Sloyan
*Attorney, Agent, or Firm*—Arthur L. Plevy

[57] ABSTRACT

There is disclosed an electronic scale which may, for example, be used as a bathroom scale, medical room scale, or otherwise. The scale provides a digital display of the weight of an object placed or positioned on a weighing platform and can provide said display in terms of the conventional system or the metric system by varying the time base or gate as applied to a counter. The counter has another input which provides a frequency related to the object's weight; which frequency is counted in accordance with the duration of the time gate, to enable a digital display of the weight.

Apparatus is shown for providing a time base for the scale and employs two voltage to frequency converters, one to provide a frequency related to the weight of an object and the other to provide a time base; both of which vary according to supply fluctuations. The circuitry provides a number of pulses to the counter indicative of the true weight and independent of the supply voltage.

7 Claims, 3 Drawing Figures

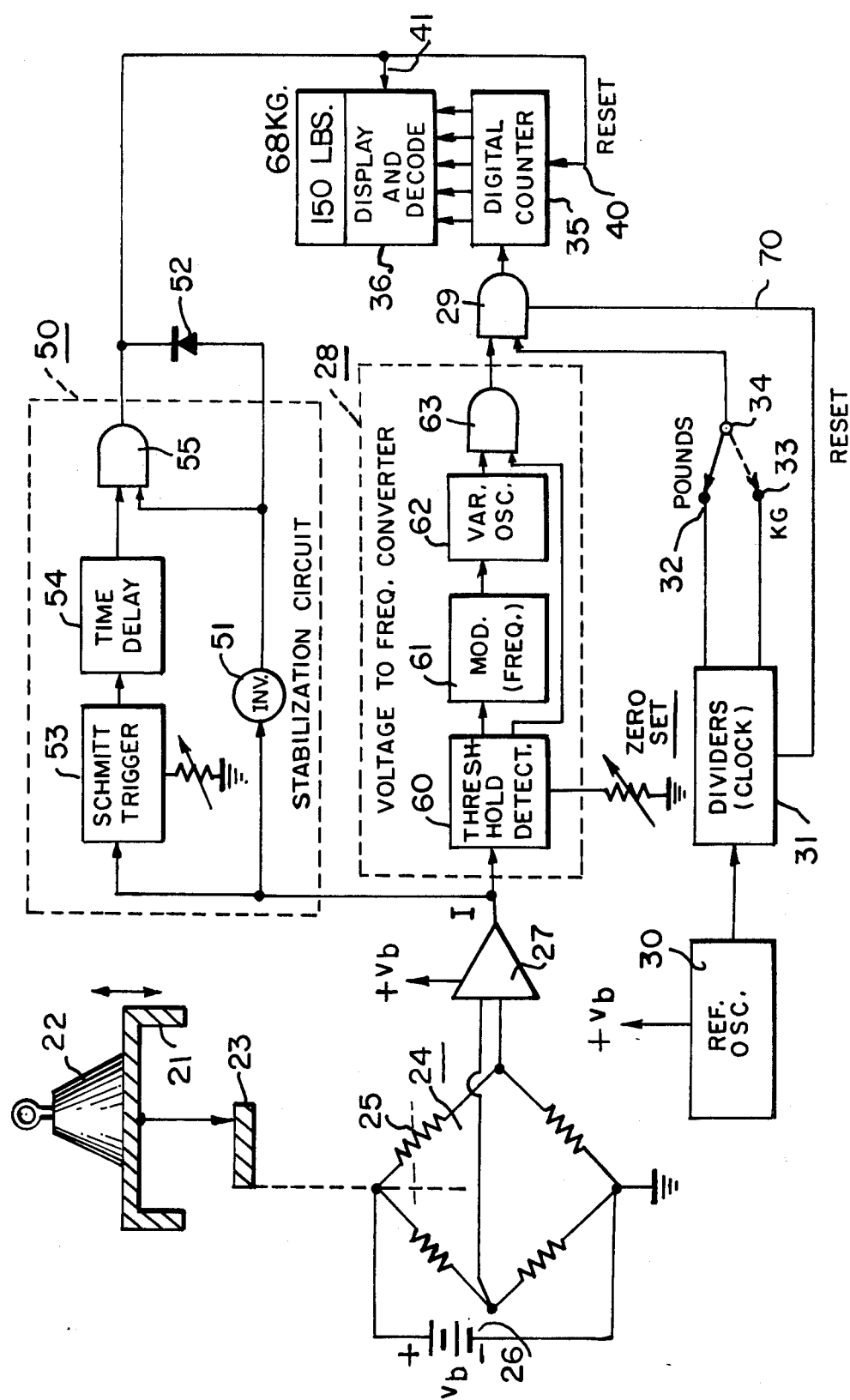

APPARATUS FOR CONVERTING AN ANALOG SIGNAL INTO DIGITAL FORM PARTICULARLY ADAPTED FOR USE IN DIGITAL COUNTER DISPLAYS

This is a divisional of application Ser. No. 631,383, filed on Nov. 12, 1975 now U.S. Pat. No. 4,041,289 issued on Aug. 9, 1977 entitled DIGITAL SCALE OR WEIGHING APPARATUS

BACKGROUND OF INVENTION

This invention relates to scales in general, and more particularly to a scale capable of providing a digital display of an object's weight.

There presently exists a number of patents which employ electronic devices and counters to provide a display indicative of the weight of an object placed on a weighing platform.

As such, many of the prior art patents relate to relatively complicated scale or weighing operations, such as batch scales which detect coincidence between the weight of an object and a predetermined weight which may be entered into the apparatus prior to emplacement of the object on the platform. Such apparatus is shown in U.S. Pat. No. 3,582,619 entitled DIGITAL CUT-OFF by R. F. Orr issued on June 1, 1971.

Other patents as U.S. Pat. No. 3,853,015 entitled DIGITAL SCALE AND METHOD by F. C. Rock and issued on Mar. 28, 1972 show electronic encoding apparatus which provide a digital display of the weight of an object. These devices operate by detecting or responding to the position of a dial pointer associated with an ordinary scale and do not employ load cells to provide voltages or signals proportional to the weight of an object.

Other patents as U.S. Pat. Nos. 3,714,401; 3,881,651; 3,740,536 and 3,789,202 show various scale configurations as balances, conveyor scales to provide a digital display of the weight of an object and do so by employing electronic circuitry.

In any event, there is a need for an inexpensive and reliable scale apparatus which is completely electronic in nature and employs a minimum of mechanical parts. It is further desired to provide an inexpensive scale structure or apparatus which employs a counter for providing a digital indication of weight by interfacing with a simple and inexpensive analog to digital converter.

Another desireable feature is to provide a scale apparatus which can be easily converted to display weight in both the conventional system and the metric system to enable a user to quickly select the system in which the weight of the object is to be displayed.

It is therefore an object of this invention to provide an inexpensive digital scale apparatus employing a minimum of mechanical components, while providing an accurate and reliable display of the weight of an object.

DESCRIPTION OF PREFERRED EMBODIMENT

An electronic scale for displaying the weight of an object in digital form comprises a transducer operative to provide an analog signal proportional to said weight, means responsive to said analog signal to provide a frequency linearly related to said signal and means for gating a predetermined number of cycles of said frequency according to a desired system of weights to store a number indicative of the weight of said object; which number as stored can be displayed as a given number of significant digits, completely manifesting the weight of said object.

Other embodiments include gating means which operate to provide a correct gating signal relatively independent of undesired variations in said analog signal.

BRIEF DESCRIPTION OF FIGURES

FIG. 2 is a partial block and schematic diagram of an alternate electronic scale apparatus.

DETAILED DESCRIPTION OF FIGURES

Figure 1:
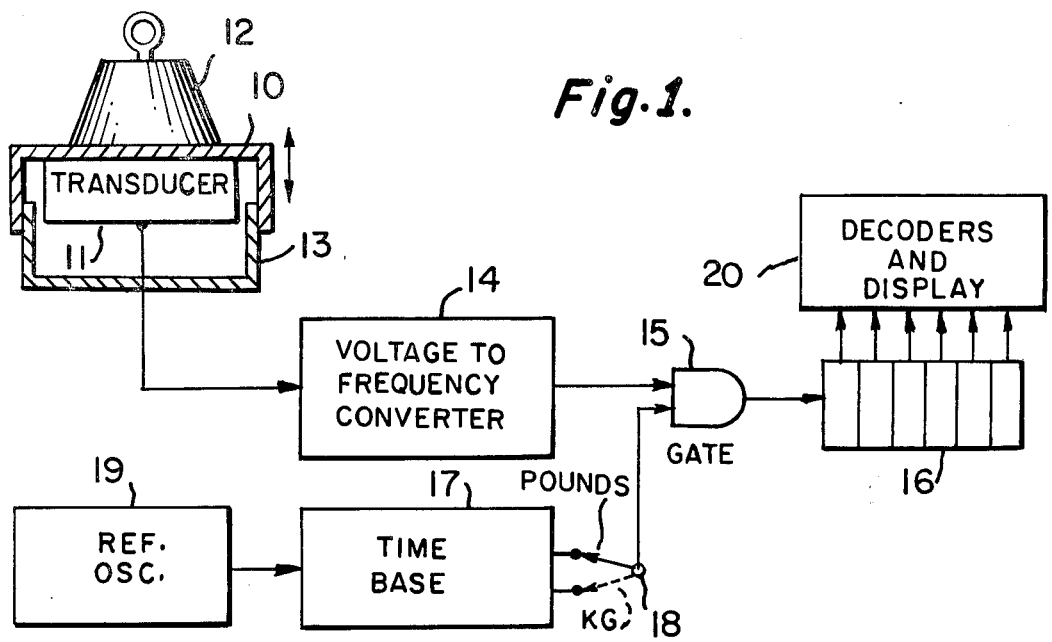
FIG. 1 is a block diagram of a digital electronic scale according to this invention.

FIG. 1 depicts a simplified block diagram of a scale apparatus according to this invention. As previously indicated, the scale may be employed as a bathroom scale or other device used in supermarkets, physican's offices for providing a digital display of the weight of an object 12 placed on a weighing platform 10.

Referring to FIG. 1, there is shown an object 12 positioned on a weighing platform 10. The object 12 may be a person or other object whose weight is to be displayed. The platform 10 is associated with a base member 13, which is positioned on a horizontal reference plane. An object 12 causes the platform 10 to move downwardly with respect to the plane or base 13. The platform 10 and base member 13 are conventional scale components and many examples of suitable apparatus exist in the prior art.

As is conventional, the platform 10 responds by moving downwardly according to the weight of the object 12 to exert a force or pressure on a transducer 11 coupled between the platform 10 and the base 13.

The transducer 11 or load cell can be of a number of different devices for converting a pressure of a force into an electrical signal. As such, the transducer 11 may comprise a Wheatstone bridge configuration employing piezoresistive elements or other pressure converting devices to provide a varying electrical signal indicative of the weight of the object 12 on the platform 10. As such, the transducer 11 supplies an analog signal in terms of a voltage or a current having a magnitude which varies according to the weight of the object 12.

This analog signal cannot be easily converted for digital display purposes without the use of an analog to digital converter (A/D converter). Essentially, the prior art shows many techniques for performing analog to digital conversion. Primarily, the object of such devices is to respond to an analog signal to provide therefrom a digital code or a digital signal which can be processed by conventional digital circuitry to eventually activate a digital display.

There are many techniques for converting an analog signal to a digital signal. Examples of suitable circuitry and techniques can be had by reference to a text entitled ARITHMETIC OPERATIONS IN DIGITAL COMPUTERS by R. K. Richards, published in 1958 by the D. Von Nostrand Company, Inc.

In this invention, the analog output voltage signal from the transducer 11 is applied to an input terminal of a voltage to frequency converter 14. The output of the voltage to frequency converter 14 is a repetitive signal having an output frequency linearly related to the voltage applied to the input or that voltage obtained from the transducer 11. The output signal from the voltage to frequency converter 14 is applied to one input of a gate circuit 15; which may be an AND or NAND gate and basically, functions to provide an output signal during the presence of two or more signals at the input terminals. Another input to the AND gate 15 is derived from a relatively stable reference oscillator circuit 16. The output signal from the oscillator 16 may be a stable signal derived from a crystal controlled oscillator or similar device. The stable signal output from the oscillator 16 may be applied to the input of a time base generator 17; which may include a plurality of bistable multivibrators for dividing the signal from the oscillator 16 to provide a number of predetermined time base signals of desired durations.

The output terminals of the time base generator 17 are applied via a switch 18 to the input of the AND gate 15.

The switch 18 has a common arm coupled to an input of the time base and two selectable contacts coupled to two different clock or gate signals available from the dividers included in the time base circuit 17.

The two selectable contacts of the switch 18 are designated as pounds and kilograms (KG) to enable a user to select either a pound display or a kilogram display of weight according to the setting of switch 18. Other settings or conversions can be implemented as well; as will be apparent and hence, one could provide gating and selection for ounces or grams and so on. The gate 15 will provide an output for the coincidence of the two signals at its inputs and hence, the signal available from the converter 14 will appear to the output of gate 15 during the duration of the gate pulse from the time base generator 17.

The output from the gate 15 is coupled to the input of a counter circuit 16; which counts the number of pulses gated via the gate 15. The member 16 is a conventional digital counter; which may include a plurality of cascaded flip-flop or binary multivibrators arranged in a counting configuration.

The outputs of the counter 16 are applied to the inputs of a decoder and display circuit 20 for decoding and displaying the number of pulses counted and stored during the gating interval to provide the user with a visual and direct read-out of the weight of the object 12 on the platform 10.

The display 20 is a digital read-out display and may include light emitting diodes (LEDs), liquid crystals and so on to provide a user with a direct readout of the object's weight.

EXAMPLE OF OPERATION

Assume that the apparatus of FIG. 1 is to be employed as a bathroom scale and is capable of providing a display of the weight of persons, with a maximum indication of 300 pounds. The transducer 11 will provide a given voltage output for the maximum weight of 300 pounds; which voltage will decrease linearly for weights less than this, and for example, would be one-half the given voltage for a weight of 150 pounds.

Further assume that the output of the transducer 11 is one volt for a 300 pound weight 12 and one-half of a volt for a 150 pound weight and so on.

Thus, 300 pounds on platform 10 would cause the transducer 11 to provide a one volt signal to the input of the converter 14 and 150 pounds would provide a one-half volt signal. It is noted that these values are by way of example only and other voltages could be developed as well.

It can therefore be seen that the converter 14 can be caused to provide an output signal of 10,000 Hz for a one volt input signal and an output signal of 5,000 Hz for a one-half volt input signal. Other frequencies could be provided as well for other input voltages, both higher or lower, depending upon the converter 14 used.

If the time base selected were to be about 300 milliseconds, one would enable gate 15 for this period and gate 15 would transmit 3,000 pulses at a 10,000 Hz rate during this interval. The decoders and display 20 would decode the first three most significant digits and provide a reading of 300, which would correspond to a weight of 300 pounds. A weight of 150 pounds would provide an output of 5,000 Hz, which would cause the counter to receive 1500 pulses in 300 milliseconds and hence, a three digit display of 150 pounds would be provided.

Since a kilogram is approximately equal to 2.205 pounds, one would divide the pounds by 2.205 kilograms. Hence, a person weighing three hundred pounds would weigh approximately 136 kilograms. In this event, by selecting the time base via switch 18, one provides a time base of approximately 136 milliseconds to decode and count 1360 pulses during this interval or obtain a display reading of 136 kilograms.

It is therefore seen that by selection of the time base, one can obtain a display directly in terms of pounds or kilograms. The time base and frequencies can be shorter or longer as desired. A major aspect being in the use of voltage to frequency converter to convert the output voltage of the transducer 11 to a repetitive signal and thereafter count the transitions of the signal by means of a selectable time base which is of a reasonable duration to obtain a direct readout of weight. The time base desireably is relatively long, since a longer time base gives a more reliable count.

Referring to FIG. 2, there is shown a block diagram in greater detail of a scale apparatus employing a digital or direct readout.

A moveable weighing platform 21, as conventional, has positioned thereon an object 22, whose weight is to be displayed.

The platform 21 is mechanically coupled to a transducer structure 24 via a number of suitable coupling means 23. Basically, the transducer may be a cantilever beam transducer and as such, would be positioned so that the weight 22 causing movement of the platform 21, would apply a force or pressure to the transducer 24. The transducer 24 is shown in a Wheatstone bridge configuration having one or more arms including a variable resistor as 25. The resistor 25 may be a piezoresistive device whereby the resistance varies according to a pressure or force applied thereto. The Wheatstone bridge transducer 24 is biased by means of a battery 26 ($V_B$) or a source of potential, which is used to bias or apply operating potentials to the electronic circuitry comprising the scale.

Operation of a Wheatstone bridge transducer as 24 is well known and essentially, for no weight on the platform 21, the bridge 24 is balanced and provides no output. Placement of a weight as 22 on the platform 21 applies a force or pressure to the bridge and affects the resistance of the variable resistors as 25 to unbalance the bridge and hence, provide an analog output signal across the central arm of the bridge. The output signal is linearly related to the weight 22 applied on the platform 21 as above indicated.

The output of the bridge 24 is applied to the input of a DC amplifier circuit 27, which provides an amplified signal at the output terminal. This signal is linearly related to the signal from the bridge transducer 24 according to the gain of the amplifier.

The amplifier 27 is biased from the battery $V_B$. It thus can be seen that the amplifier 27 can provide an increased range of signals for the output of the bridge circuit 24 and hence, the values discussed above (as one volt for three hundred pounds and so on) can be amplified and varied accordingly.

As indicated, the output of the amplifier 27 is applied to an input terminal (I) of a voltage to frequency converter circuit 28. The output of the voltage to frequency converter is applied to one input of a gate circuit 29.

The other input of gate circuit 29 is derived from a clock source 31 including a reference oscillator 30. Hence, by means of selecting the frequency of the oscillator 30 in conjunction with the dividing circuits included in module 31, one can obtain a time base related to pounds at switch terminal 32 and a time base related to kilograms at switch terminal 33.

Either time base can be selected by the user or elsewise and applied to the input of gate 29 to cause a display of the weight of object 22 in either pounds, kilograms or any other desired quantity. The output of the gate 29 is applied to a standard digital counter circuit 35, which may employ bistable multivibrators. Such counters as 35 are well known in the art and numerous examples of suitable circuitry exist. See for example, a text entitled PULSE AND DIGITAL CIRCUITS by J. Millman and H. Taub, McGraw-Hill Book Company, Chapter 11, entitled "Counting Circuits". Such counters as 35 are available in integrated circuit modules and are used extensively in electronic watches, calculators and so on, and are inexpensive and easily obtained.

The counter 35 may be capable of counting and displaying three or more digits indicative of the weight of the object 22; although for most ordinary purposes, three digits are sufficient. In any event, as indicated, one may wish to count four digits or more and display only three to assure that the display and decode circuits 36 associated with the counter 35 do not exhibit a change in the last count or last place.

The counter 35 thus stores a count of the pulses received from gate 29 and displays the same on a direct readout display. The count stored is decoded and applied to a LED or other display via the display and decode circuits 36, which are conventional.

Thus, shown above the display and decode circuits 36 is an indication of 150 pounds and one of 68 kilograms. These numbers would be displayed depending upon the position of switch 34 as selecting the kilogram or pound gating interval.

Also shown is a reset terminal 40 associated with the counter 35. Normally with no weight on the platform 21, the counter would be reset to all zeroes and the display would be inactivated via lead 41 to conserve power.

As explained, the platform 21 is mechanically coupled to a base and usually includes a spring mechanism to assure the return to a zero position. With no weight on the platform 21, the platform 21 takes time to stabalize when a weight 22 is first placed thereon.

This characteristic is familar to most users of, for example, a bathroom floor scale. Hence, when one first stands on the platform, the scale vibrates and the needle fluctuates until the platform and scale stabilizes and then one can read the weight on the scale via the needle.

To assure that the display will be activated after an initial stabilization period, a time delay circuit 50 is employed. It is noted that there are many configurations and techniques for providing such a delay as 50 and hence, the function of the same will be described before a particular circuit implementation is discussed.

The function of the time delay circuit 50 is to first assure that the counter 35 and display 36 is set to all zeroes for the absence of a weight on platform 21. As soon as a weight 22 is positioned on the platform, the time delay 50 functions to inhibit the counter and display until a predetermined stabilization period elapses to assure that the weight as displayed is correct and that the mechanical linkages between the platform and the scale base hve stabilized.

The circuit 50 operates as follows:

First, assume that there is no weight 22 on the platform 21. In this case the bridge 24 is balanced and the amplifier 27 exhibits a minimum output or an output corresponding to the absence of a weight 22. It is noted that conventional balancing arrangements for the bridge 24, as well as the platform 21, can be employed to balance out or null out for the weight of the platform as well as any bridge offset. Hence, the entire scale can be "nulled" or zeroed for the absence of any weight on the platform 21.

Therefore, when a weight 22 is not on the platform 21, the low output of amplifier 27 causes the gate 51 to provide a high output which supplies a reset signal to the counter 35 and for the display 36 via a diode 52. As soon as a weight is placed on the platform 21, the output of amplifier 27 begins to rise. The Schmitt trigger circuit 53 detects this rise and changes state when the output of amplifier 54 exceeds a predetermined value.

The Schmitt trigger is a well known circuit and operates accordingly. The level that the Schmitt trigger changes state can be set at any desired value as for example, to a setting for a voltage corresponding to two or five pounds. The change in state of the Schmitt immediately triggers a time delay multivibrator 54 which provides a predetermined pulse length of a duration determined by the stabilization period required. This pulse is applied via gate 55 to keep the counter 35 reset. Since the voltage at the output of the amplifier 27 is rising, the gate 51 no longer keeps the counters reset, but the gate 55 will do so via the time delay multi 54. Hence, the counter does not count during the period of time delay 54. As soon as the time delay pulse from 54 terminates, and the weight is still on the platform 21, the display and counter 35 are activated and the count indicative of the weight of the object 22 is displayed. When the weight is removed, the gate 51 operates to reset the circuitry. If the weight 22 is removed prior to the termination of the time delay 54, the counters are still reset via the gate 51.

Thus, there is shown one of a number of stabilization circuits 50 which can be included in the electronic scale apparatus.

VOLTAGE TO FREQUENCY CONVERTER CIRCUIT 28

As indicated, the analog to digital converters employed herein are known as voltage to frequency converters. It is noted that there are numerous techniques available in the prior art to convert a voltage to a frequency and such circuits are well known and many different configurations can be adapted for use in the scale apparatus shown. There are also voltage to frequency converters available in integrated circuit form which can be employed for module 28.

One such circuit is included within dashed line 28. The circuit comprises a threshold detector 60 which has input derived from amplifier 27. The threshold detector 60 functions to provide an output when the output of amplifier 27 exceeds a zero set value and can be used to zero the entire scale. For example, assume that with no weight 22 on the platform 21, the amplifier provides a DC output which corresponds to zero weight. The threshold detector 60 is zero set so that it provides a first output for this value from amplifier 27. As soon as the output of the amplifier 27 exceeds the zero value, the detector 60 linearly follows the same and this signal is applied to a modulator circuit 61. The modulator 61 linearly varies the frequency of an oscillator 62 according to the magnitude of the DC signal applied. The oscillator 62 may comprise an astable multivibrator whose output is frequency modulated by varying the magnitude of a capacitor as a varactor diode by means of the DC supplied to modulator 61. Hence, the frequency of the oscillator 62 is a function of the DC applied at the input of the converter. The output frequency is applied via a gate 63 to gate 29 for counting. The gate 63 is activated when the threshold is exceeded. The gate 63 may also be activated after the time delay 54, as can gate 29 to only enable the application of pulses to the counter 35 after the scale has stabilized.

Thus, the following sequence of events take place when a weight 22 is placed on the platform 21:

Initially, all the counters 35 are reset to the all zero position. As soon as a weight is placed on the platform, the counters 35 are inhibited until the scale mechanism stabilizes. At this time, the amplifier 27 has reached a steady DC level indicative of the weight 22 (e.g. one volt for 300 pounds). This signal is applied to the modulator 61 to vary the output frequency of the oscillator 62, which provides a frequency corresponding to the DC signal (10,000 Hz). Assume that the gate selected via switch 34 is indicative of pounds. The gate for example, is 300 milliseconds. Thus, gate 29 allows 3,000 pulses to enter counter 35, which displays the three most significant digits and hence, the display reads three hundred pounds.

As soon as a full gate cycle (300 milliseconds) is keyed into gate 29, the divider or clock inhibits gate 29 via the lead 70 to thereby provide a stable reading of the weight of the object 22. When the weight 22 is removed, the circuitry is reset back to zero and the scale is ready for another cycle of operation.

There are numerous ways of controlling the gating to gate 29 as via the time delay 50, as well as the clock 31 to assure that a full gate period is used to count the pulses from the converter 28 and thereafter to store and display that count. Such techniques are known in the counter and digital display art. Similarly, if desired, the counter and display can be updated as long as the weight 22 remains on the scale and an average of the weight can be provided.

Figure 3:
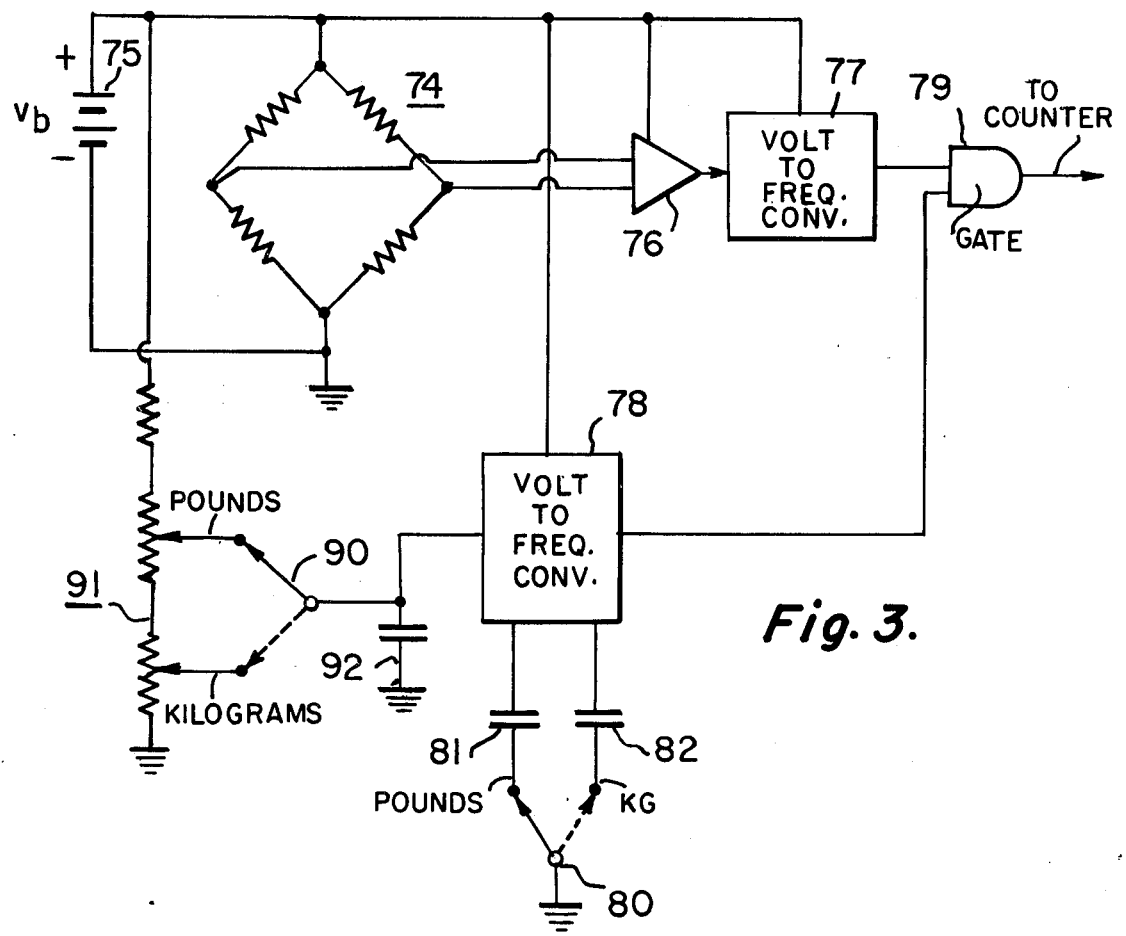
FIG. 3 is a schematic diagram of a clock circuit which tracks potential supply variations to compensate for the same to enable accurate readings in an electronic analog to digital conversion system used in this invention.

Referring to FIG. 3, there is shown clock circuitry for providing a time base gate in conjunction with a voltage to frequency converter without the necessity of regulation of the battery or supply voltage.

The technique has applicability in general and is not limited to use in electronic scales or associated equipment, but can be employed in analog to digital converters employing voltage to frequency converters in general.

Referring to FIG. 3, there is shown a Wheatstone bridge transducer 74 (as 24 of FIG. 2). As indicated, other transducer configurations and other strain gages can be employed as well, to provide an analog signal as a current or voltage which is related to a force or pressure.

As such, the bridge configuration 74, due to the inclusion of variable impedances as piezoresistors, has to have a bias supplied to the same.

It is also desired that the bias is maintained generally constant as the supply voltage via the battery 75 affects the balancing and operation of the bridge. The prior art utilized Zener diodes or other regulators, which are relatively expensive, dissipate energy and add to the complexity of the circuit.

In any event, as the supply voltage ($V_B$) 75 varies, so does the output of the bridge 74, as amplified by the DC amplifier 76.

The supply 75 as a battery will, of course, decrease in voltage as its use is extended. The value of the battery voltage 74 will also vary according to the load impressed thereon and hence, undesireably offset the output of the bridge 74.

Therefore, for a change in battery 75 voltage, the output of the bridge 74 varies and would provide an error signal to the amplifier 76. This error signal would be converted to a frequency shift in the voltage to frequency converter 77 which would now undesireably provide a fixed error frequency to the input of the counter gate 79 (as gates 15 and 29 of FIGS. 1 and 2).

Thus, by using a stable clock as shown in FIGS. 1 and 2, one would have an error introduced if the battery voltage were not conventionally regulated and therefore drifted or varied in value.

The apparatus depicted in FIG. 3 circumvents this problem and eliminates the need for separate regulation.

A time base generator comprises a voltage to frequency converter module 78 of similar design to converter 77. The oscillator circuit included in the voltage to frequency converter 78 can be caused to operate at two different quiescent modes or frequencies by a selector switch 80. Switch 80 selects a frequency related to a "pound" time base or a "kilogram" time base. One way of doing this is by the inclusion of selectable capacitors as 81 and 82; to vary the frequency of the astable or other oscillator configuration.

Another simpler way will be further explained in conjunction with selector switch 90.

The input to the time base voltage to frequency converter 78 is derived from a voltage divider 91 biased from the battery supply 75. The voltage divider 91 assures that the input voltage to the converter 78 is such that the converter provides a fixed output frequency indicative of the value of the time base.

For example, assume that the frequency converter 72, as above explained, provides 10,000 Hz for a weight of 300 pounds corresponding to a one volt input from the bridge 74.

Thus, a three hundred millisecond clock can be used or a frequency signal of 333 Hz. A DC is applied via the divider 91 to cause the voltage to frequency converter 78 to provide this output and hence, the gate 79 will provide an output when gated, which is indicative of the weight.

If the battery supply 74 varied, so would the bridge balance. However, the voltage applied to the divider 91 would also vary and hence, the output of the voltage to frequency converter 78. Thus, the number of pulses at the output of gate 79 would not vary and remains independent of the supply voltage V6.

Since the frequency of the output of converter 78 is dependent upon the DC at the input; switch 90 can be used to select either "pounds" or "kilogram" time base in lieu of switch 80. Capacitor 92 serves to stabilize the voltage at the input to the converter 78. Assume that the output of the amplifier 76 is related to:

$V_S = K_S V_B$ where:
$V_S$ = voltage output of amplifier
$K_S$ = constant gain of amplifier
$V_B$ = function of the battery voltage The frequency out of the converter 77 would then be:
$f_S = K_S V_B$
$K_S$ = constant
$V_B$ = function of battery voltage The input to converter 78 would be related to:
$V_T = K_T V_B$
$K_T$ = constant
$V_T$ = input to converter 78
$V_B$ = function of battery voltage The output of the converter 78 is related to:
$f_T = K_T V_B$
where:
$f_T$ = time base
$K_T$ = constant
$V_B$ = function of battery voltage The time base T is:
T = 1/ft Thus, the number of counts from gate 79 is equal to the output frequency $f_S$ times the period or time base T; hence:

counts from gate 79 = $f_S \times T$ $$= f_S \left(\frac{1}{f_T}\right) = K_S V_B \frac{1}{K_T V_B} = \frac{K_S}{K_T}$$

Hence, the number of counts from gate 79 is independent of the supply voltage $V_B$.

Thus, one need not regulate the supply and one would still obtain the correct weight display by assuring that the time base (T) will vary according to the variations in supply voltage as this will affect the output frequency from the analog to digital converter 77.

Since the time base or gate is also effected, the number of pulses will be independent of battery variation.

This technique of deriving the time base eliminates the need for accurately calibrated clocks as well as the need for regulation of the supply voltage.

Other advantages of the apparatus described will become apparent to those skilled in the art.

We claim:

1. In a system of the type employing an analog transducer biased from a source of operating potential, which undesireably varies to effect the output of said transducers, the combination therewith of apparatus for converting the analog signal into a digital form relatively independent of said variation of said source, comprising:

(a) a voltage to frequency converter having an input responsive to said analog signal to provide at an output thereof, a frequency related to said analog signal, said frequency at said output being undesireably effected by said source variation to therefore contain a component related to said source variation and unrelated to said true value of said analog signal, (b) counting means coupled to said output and operative to count said frequency upon application of a suitable predetermined duration, gating waveform to said counting means, to thereby provide a count indicative of said frequency and therefore of both said analog signal and said undesireable variation, (c) a gate generator including a second voltage to frequency converter responsive to said potential source to provide said suitable gating waveform which varies from said predetermined duration according to said undesired potential variation to thereby compensate said gating waveform according to said undesireable variation in said analog signal to enable said counter to correctly count said frequency strictly according to said true value of said analog signal and relatively independent of said variations, and (d) means for applying said gating waveform to said counter.

2. An analog to digital converter, comprising:

(a) means operative when biased from a source of potential to provide at an output, an analog signal indicative of at least one characteristic of an object to be monitored, said signal containing a component related to said undesireable variation of said source of potential and unrelated to said true value of said analog signal indicative of said characteristic of said object, (b) first conversion means including a first voltage to frequency converter coupled to said analog means and responsive to said signal to provide a frequency at an output proportional to said signal, whereby said frequency can be counted during a predetermined interval to provide a digital indication directly related to said analog signal, (c) second conversion means including a second voltage to frequency converter responsive to said potential source to provide a frequency at an output indicative of said predetermined interval signal according to the magnitude of said source of potential, wherein said predetermined interval signal varies according to said undesireable source of potential variation, (d) logic means responsive to said first and second conversion signals and operative to provide said digital indication according to said predetermined interval signal and relatively independent of said source of potential, whereby said digital indication is directly indicative of said true value of said analog signal.

3. In a system of the type employing a transducer biased from a source of operating potential, which source undesireably varies to effect the analog output of said transducer, the combination therewith of apparatus for converting the analog output of said transducer into a digital form relatively independent of said variation of said biasing source, comprising:

(a) a first voltage to frequency converter having an input coupled to said transducer and responsive to said analog signal to provide a frequency at an output of said converter related to said analog signal, (b) a second voltage to frequency converter having an input coupled to said biasing source to provide at an output a signal frequency of a predetermined duration selected according to the magnitude of said source whereby said signal frequency varies from said predetermined duration as said source varies, and (c) means responsive to said signal from said first converter and said signal from said second converter and operative to provide a digital output according to said signals manifesting the number of cycles of said first converter frequency during said predetermined time duration, which output is a direct indication of said analog signal relatively independent of said source variation.

4. The apparatus according to claim 3 wherein said biasing source is a battery.

5. The apparatus according to claim 4 further comprising a voltage divider coupled between said source and a point of reference potential and means coupling the input of said second voltage to frequency converter to a point on said divider to provide a bias voltage thereto indicative of said predetermined duration signal.

6. The apparatus according to claim 5 wherein said means include a switch for applying in a first mode, a first voltage to said converter and in a second mode, a second voltage.

7. The apparatus according to claim 3 wherein said transducer is a Wheatstone bridge employing at least one piezoresistive element.

* * * * *